(12) United States Patent
Hacker

(10) Patent No.: US 9,105,604 B2
(45) Date of Patent: Aug. 11, 2015

(54) HBT CASCODE CELL

(71) Applicant: Teledyne Scientific & Imaging, LLC, Thousand Oaks, CA (US)

(72) Inventor: Jonathan B. Hacker, Thousand Oaks, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 0 days.

(21) Appl. No.: 14/148,429

(22) Filed: Jan. 6, 2014

(65) Prior Publication Data

US 2015/0194407 A1 Jul. 9, 2015

Related U.S. Application Data

(60) Provisional application No. 61/836,484, filed on Jun. 18, 2013.

(51) Int. Cl.
*H01L 29/737* (2006.01)
*H01L 23/00* (2006.01)
*H01L 27/102* (2006.01)

(52) U.S. Cl.
CPC ............ *H01L 24/41* (2013.01); *H01L 27/1022* (2013.01); *H01L 29/737* (2013.01)

(58) Field of Classification Search
CPC .............. H01L 23/535; H01L 23/5386; H01L 2223/6605; H01L 29/737; H01L 24/41; H01L 27/1022; H03F 2203/45288; H03F 3/16; H03F 3/165

See application file for complete search history.

(56) References Cited

U.S. PATENT DOCUMENTS

| 5,436,475 A * | 7/1995 | Tews et al. ..................... 257/197 |
| 6,121,842 A * | 9/2000 | Adlerstein et al. ............. 330/307 |
| 7,071,786 B2 * | 7/2006 | Inoue et al. .................... 330/311 |

* cited by examiner

*Primary Examiner* — Jerome Jackson, Jr.
*Assistant Examiner* — Steven B Gauthier
(74) *Attorney, Agent, or Firm* — Brooks Acordia IP Law, PC

(57) ABSTRACT

A cascode gain stage apparatus includes a common-emitter connected transistor having a first base metal contact, first emitter metal contact, a first collector metal contact and a u-shaped first collector interface metal; and a common-base connected transistor having a second emitter metal contact, a second base metal contact, and a second collector metal contact, the second emitter metal contact in communication with the first collector metal contact through a transistor interconnect metallic strap, the second emitter metal contact disposed between the first collector metal contact and the second base metal contact. With this configuration, the first collector metal contact and second emitter metal contact are connected by the transistor interconnect metallic strap without high-aspect ratio traces to reduce crossover coupling.

20 Claims, 4 Drawing Sheets

US 9,105,604 B2

HBT CASCODE CELL

RELATED APPLICATION

This application is a continuation of Provisional Application No. 61/836,484, filed Jun. 18, 2013, which is hereby incorporated by reference for all purposes.

FEDERALLY SPONSORED RESEARCH

The invention was made with Government support under Contract No. W911QX-06-C-0052 awarded by the Defense Advanced Research Projects Agency (DARPA). The Government has certain rights in the invention.

BACKGROUND

1. Field of the Invention

This invention relates to cascode cells, and more particularly to cascode cells using heterojunction bipolar transistors.

2. Description of the Related Art

High frequency cascode cells need to have low-inductance interconnects between the two cell transistors while maintaining low capacitive coupling between device terminals. A conventional cascode cell layout may use transistors with terminals ordered in-line as Base-Emitter-Collector (Q1) and Base-Emitter-Collector (Q2). Unfortunately, this configuration leads to a convoluted physical layout that introduces unwanted capacitive coupling and inductance between transistors in the cascode cell. A need continues to exist to reduce capacitive coupling between device terminals and to reduce inductance in transistor interconnects.

SUMMARY

A cascode gain stage apparatus includes a common-emitter connected transistor having a first base metal contact, first emitter metal contact, a first collector metal contact and a u-shaped first collector interface metal, and a common-base connected transistor having a second emitter metal contact, a second base metal contact, and a second collector metal contact, the second emitter metal contact in communication with the first collector metal contact through a transistor interconnect metallic strap, the second emitter metal contact disposed between the first collector metal contact and the second base metal contact so that the first collector metal contact and second emitter metal contact are connected by the transistor interconnect metallic strap without high-aspect ratio traces to reduce crossover coupling. In such an embodiment, the second emitter metal contact may be configured in a high-aspect ratio fin connected to the transistor interconnect metallic strap, and the apparatus may also include a first emitter intra-connect metallic strap in communication with the first emitter metal contact.

In another embodiment, the cascode gain stage may also include a u-shaped second collector interface metal connected to the second collector metal contact, the u-shaped second collector interface metal having first and second collector arms, and a second emitter strip bisecting the first and second collector arms, the second emitter strip in communication with the second emitter metal contact. In a further embodiment, the apparatus may include a slotted base intra-connect metallic strap in communication with the second base metal contact, the slotted base intra-connect metallic strap having first and second cutouts disposed above the respective first and second collector arms, so that the first and second cutouts reduce collector-base coupling in the common-base connected transistor. In such an embodiment, the slotted base intra-connect metallic strap and transistor interconnect metallic strap may be formed from a metal layer.

An array of cascode gain stages includes a plurality of a common-emitter connected transistors each having a first base metal contact, first emitter metal contact and a first collector metal contact, and a plurality of common-base connected transistors each including a second emitter metal contact, a second base metal contact, a second collector metal contact. A u-shaped second collector interface metal may also be included that is connected to the second collector metal contact, the u-shaped second collector interface metal having a plurality of collector arms, and including a transistor interconnect metallic strap electrically coupled between the second emitter metal contact and the first collector metal contact, the second emitter metal contact disposed between the first collector metal contact and the second base metal contact, and a slotted base intra-connect metallic strap in communication with each of the plurality of second base metal contacts, the slotted base intra-connect metallic strap having a plurality of cutouts with each respective cutout disposed above a respective collector arm in each of the plurality of common-base connected transistors. In such an embodiment, each cutout reduces collector-base coupling and base inductance and the first collector metal contact and second emitter metal are connected by the transistor interconnect metallic strap without high-aspect ratio traces to reduce crossover coupling and series inductance. In another embodiment, the array of cascode gain stages may include a second collector intra-connect metallic strap in communication with each second collector metal contact in the plurality of common-base connected transistors. The array may also include a first base intra-connect metallic strap in communication with each first base metal contact in the plurality of common-emitter connected transistors. In a further embodiment, the array may include a first emitter intra-connect metallic strap in communication with each first emitter metal contact in the plurality of common-emitter connected transistors. In such embodiments, the cutouts may be first and second cutouts disposed over first and second arms, respectively, for each of the plurality of common-base connected transistors.

In a further embodiment, a transistor includes a base metal contact on a substrate, a collector metal contact disposed on a u-shaped first collector interface metal, the u-shaped collector interface metal having first and second collector arms on the substrate, an emitter metal contact configured in a high-aspect ratio fin extending from an emitter strip in the substrate, and a slotted base intra-connect metallic strap disposed on the base metal contact, the slotted base intra-connect metallic strap having a first and second cutout disposed above first and second collector arms of a collector interface metal. In such an embodiment, an emitter transistor intra-connect metallic strap may be in communication with the emitter metal contact. The emitter metal contact and base metal contact may bisect the first and second collector arms. A transistor interconnect metallic strap may be in communication with the emitter metal contact. In such embodiments, the transistor interconnect metallic strap and the slotted base intra-connect metallic strap may be configured from a single metal layer (M1). In one embodiment of the transistor, the base metal contact is disposed between the emitter metal contact and the collector metal contact.

BRIEF DESCRIPTION OF THE DRAWINGS

The components in the figures are not necessary to scale, emphasis instead being placed upon illustrating the principals of the invention. Like reference numerals designate corresponding parts throughout the different views.

DETAILED DESCRIPTION

Figure 1:
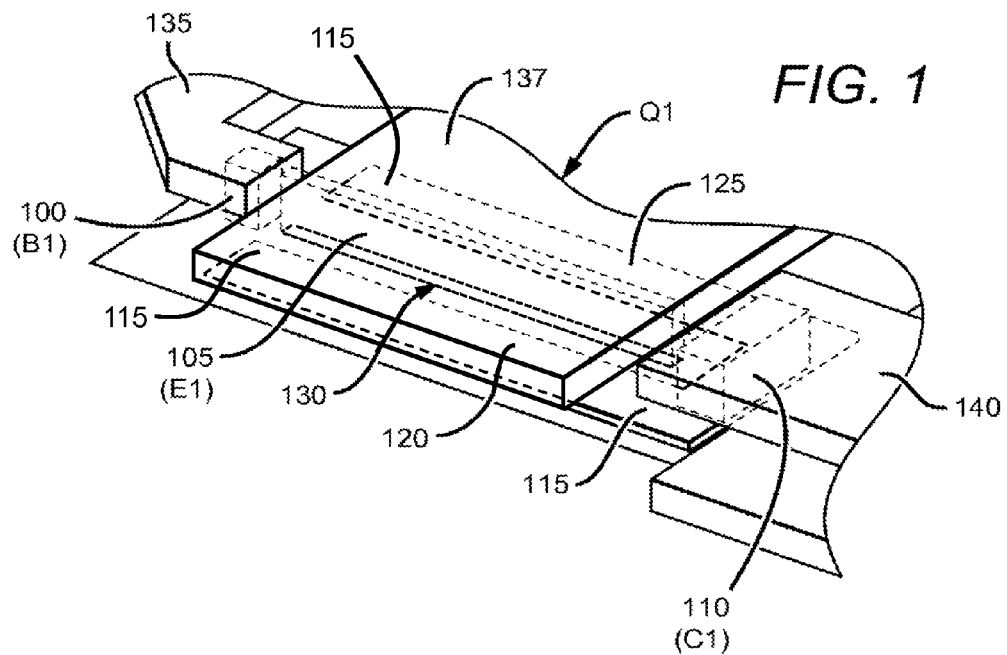
FIG. 1 is a perspective view of one embodiment of a common-emitter transistor (Q1) configured for use in a cascode gain stage having terminals ordered base-emitter-collector to emitter-base-collector (BEC-EBC) to reduce series resistance and inductances.
Figure 2:
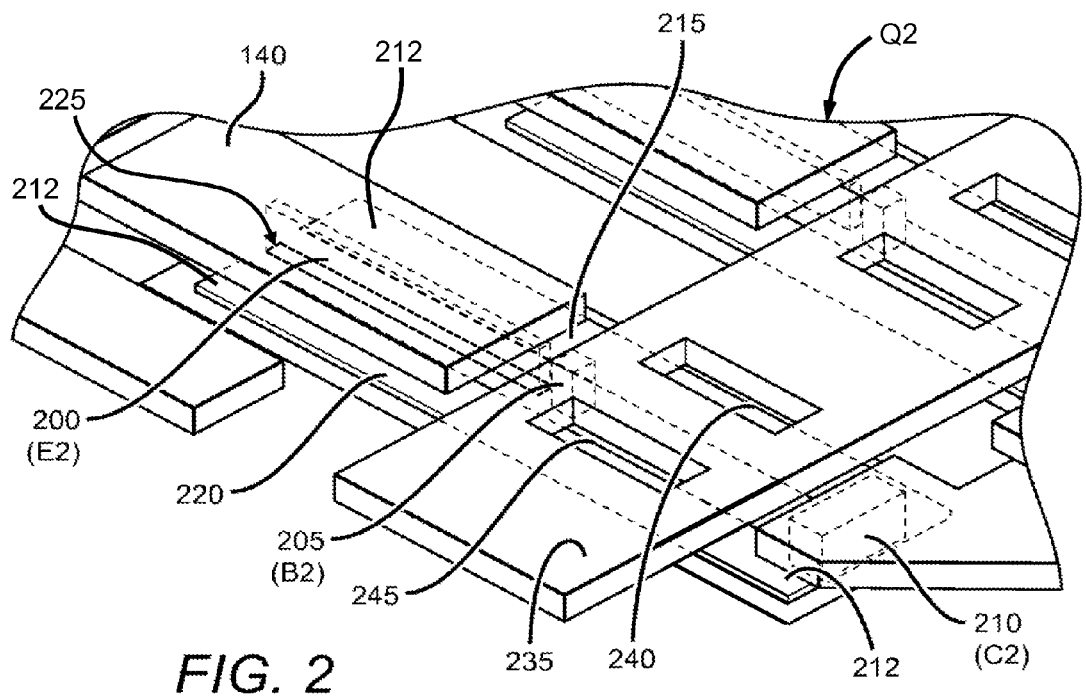
FIG. 2 is a perspective view of one embodiment of a common-base transistor (Q2) having terminals ordered emitter-base-collector (EBC) for electrical connection with the common-emitter transistor (Q1) illustrated in FIG. 1.
Figure 3:
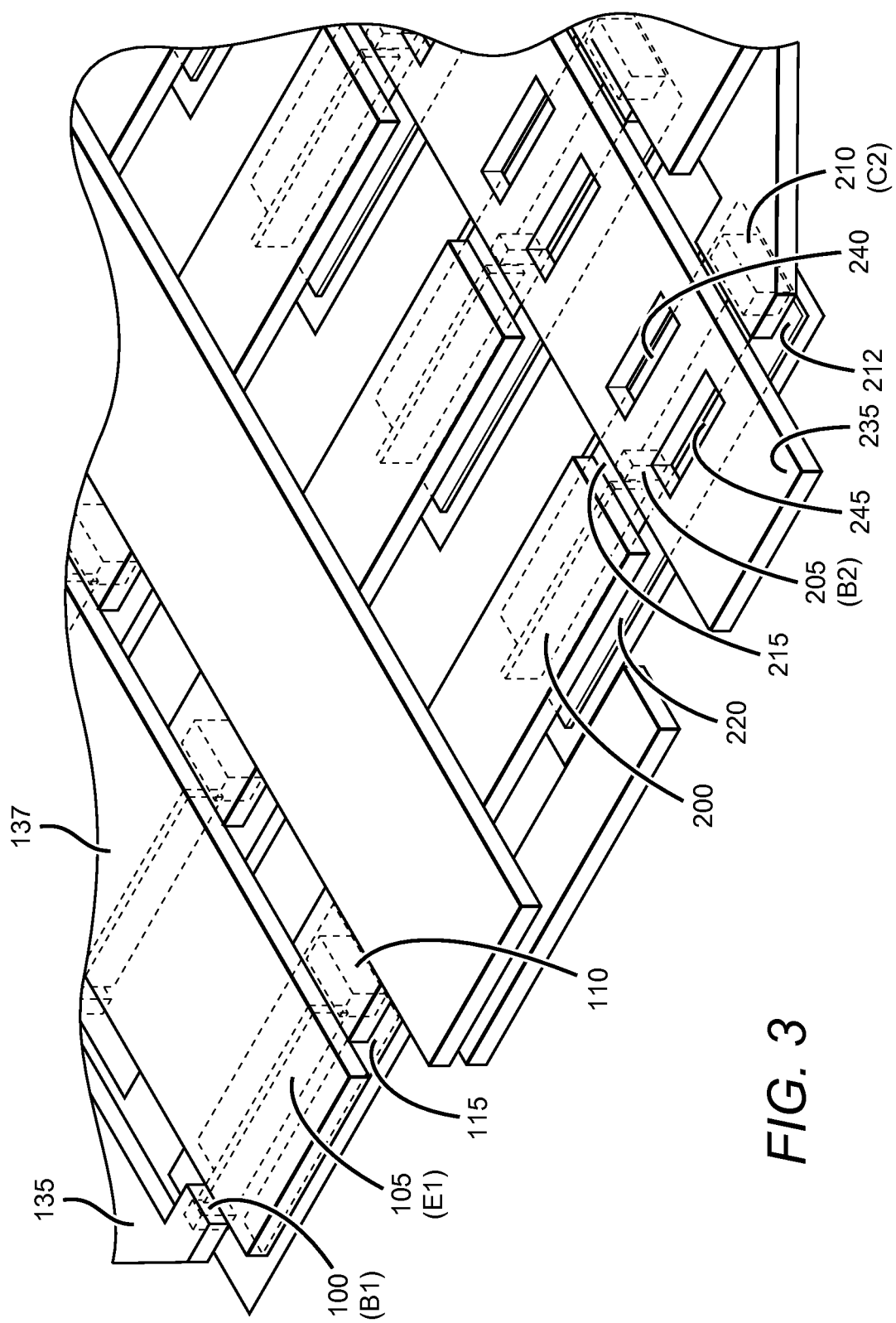
FIG. 3 is a perspective view of one embodiment of a cascode gain stage having its terminals ordered as base-emitter-collector to emitter-base-collector (BEC-EBC)

A cascode gain stage is described that has common-emitter and common-base connected transistors having terminals ordered base-emitter-collector to emitter-base-collector (BEC-EBC) using a novel structure. The collector terminal of the common-emitter connected transistor (Q1) is in communication with the emitter terminal of the common-base connected transistor (Q2) through a transistor interconnect metallic strap, without communicating through vias or high-aspect ratio traces, to reduce series resistance and series inductance. On the common-base connected transistor (Q2), an emitter strip in the transistor substrate may bisect two collector arms of a collector metal. FIGS. 1-3 (described below) collectively illustrate one embodiment of the BEC-EBC cascode gain stage. When a plurality of BEC-EBC gain stages are configured in an array, their base terminals may be in communication with one another through a base intra-connect metallic strap that has a cutout disposed above each collector arm of a collector metal to reduce base-collector capacitive coupling.

FIG. 1 is a perspective view of one embodiment of a common-emitter transistor (Q1) configured for use in a cascode gain stage having terminals ordered base-emitter-collector to emitter-base-collector (BEC-EBC) to reduce series resistance and inductance. The common-emitter transistor (Q1) has a first base metal contact (B1) 100 that serves as a base terminal for Q1. A first emitter metal contact (E1) 105 serves as an emitter terminal for Q1 and is connected to electrical ground to establish Q1 in a common-emitter connected configuration. A first collector metal contact (C1) 110 may serve as a collector terminal for Q1. The first emitter metal contact (E1) 105 is disposed between the first base metal contact (B1) 100 and the first collector metal contact (C1) 110 to define a BEC-ordered transistor.

Q1 may be further defined by a u-shaped first collector interface metal 115 that may be electrically connected to the first collector metal contact (C1) 110, with first and second collector arms (120, 125) of the u-shaped metal 115 bisected by an emitter strip 130 (the area in the transistor substrate generally under the first emitter metal contact 105). In one embodiment, the first base metal contact (B1) 100 may be formed as a post, a cylinder or as an irregular or regular prism to facilitate electrical coupling with a base transistor intra-connect metallic strap 135 to electrically connect to other bases in an array of transistors or to other components (not shown). In one embodiment, the first emitter metal contact (E1) 105 may be formed as a high-aspect ratio fin or as a plurality of high-aspect ratio fins, rather than a single fin, or one or more other interconnect structures to facilitate electrical coupling with an emitter transistor intra-connect metallic strap 137. In such a configuration, the emitter transistor intra-connect metallic strap 137 may electrically connect to other emitters in an array of transistors or to other components (not shown). The first collector metal contact (C1) 110 is formed as a block structure, but may be formed as a cylinder, an irregular prism or as another regular prism. The first collector metal contact (C1) 110 is in communication with a second emitter metal contact (E2) 200 of Q2 (see FIG. 2) through a transistor interconnect metallic strap 140.

FIG. 2 is a perspective view of one embodiment of a common-base transistor (Q2) having terminals ordered emitter-base-collector (EBC) for electrical connection with the common-emitter transistor (Q1) illustrated in FIG. 1. The second emitter metal contact (E2) 200 serves as an emitter terminal for Q2 and may be configured as a high-aspect ratio fin. In other embodiments, the second emitter metal contact (E2) 200 may be formed as a plurality of high-aspect ratio fins, rather than a single fin, or one or more other interconnect structures to facilitate electrical coupling with the first collector metal contact (C1) 110 (see FIG. 1) through the transistor interconnect metallic strap 140. The common-base transistor (Q2) may have a second base metal contact (B2) 205 that serves as a base terminal for Q2. A second collector metal contact 210 serves as a collector terminal for Q2. The second base metal contact (B2) 205 is disposed between the second emitter metal contact (E2) 200 and the second collector metal contact (C2) 210 to define an EBC-ordered transistor.

Q2 may be further defined by a u-shaped second collector interface metal 212 that may have first and second collector arms (215, 220). A second emitter strip 225 may bisect the first and second collector arms (215, 220). The second base metal contact (B2) 205 may be formed as a post, a cylinder or as an irregular or regular prism to facilitate electrical coupling with a slotted base transistor intra-connect metallic strap 235. The second collector metal contact 210 (C2) is formed as a block structure, but may be formed as a cylinder, an irregular prism or as another regular prism. The slotted base intra-connect metallic strap 235 may have first and second cutouts (240, 245) disposed above the respective first and second collector arms (215, 220) to reduce base-collector capacitive coupling from what would otherwise exist without the cutouts (240, 245). In one embodiment, the first and second cutouts (240, 245) may be rectangular. In other embodiments, they may be square, may each consist of a plurality of cutouts or may establish a cutout of a different shape or shapes to define the slotted base intra-connect strap 235. In embodiments where the slotted base intra-connect strap 235 does not connect to other base contacts, the strap 235 may still have cutouts (240, 245) to reduce base-collector capacitive coupling. In one embodiment, the slotted base intra-connect metallic strap 235 and the transistor interconnect metallic strap 140 are formed from a single metal layer (M1).

In FIGS. 1-3, although the first base metal contact (B1) 100, first emitter metal contact (E1) 105, and first collector metal contact (C1) 110 are illustrated in electrical communication with an array of transistors, the structure of the cascode gain stage is not limited to use in such a configuration. For example, Q1 and Q2 may be used as a single cascode gain stage outside the context of an array of cascode gain stages. In a single cascode gain stage configuration, the base transistor intra-connect metallic strap 135 would not be a base transistor intra-connect strap, but included as a transmission line to other devices or components or may be omitted. Similarly, the emitter transistor intra-connect metallic strap 137 and slotted base intra-connect metallic strap 235 may be transmission lines to other devices or components that are not cascode gain stages.

Figure 4:
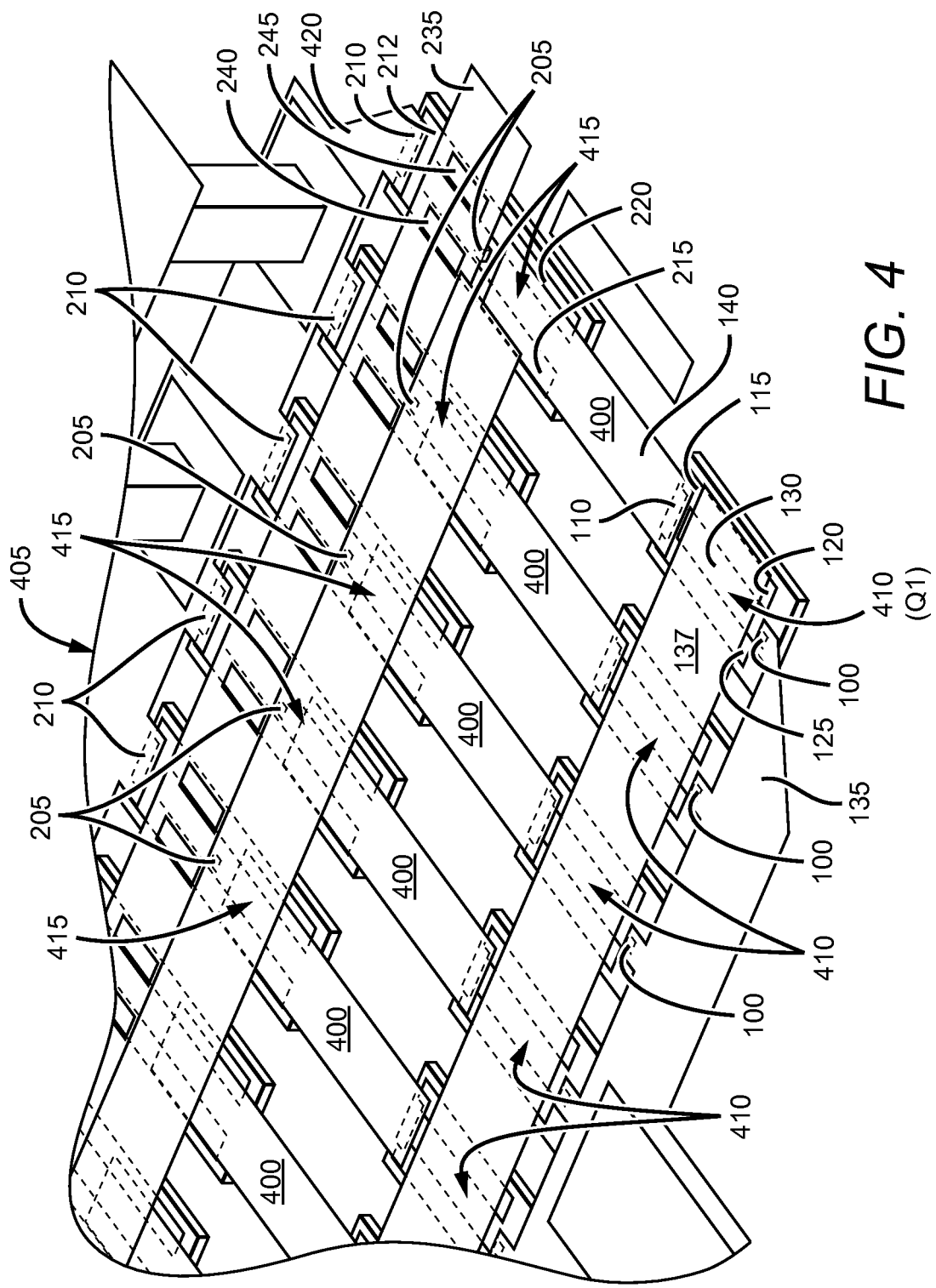
FIG. 4 is a perspective view of one embodiment of an array of cascode gain stages having their terminals ordered as base-emitter-collector to emitter-base-collector (BEC-EBC) using the novel cascode gain stage structure described above in FIGS. 1-3.

FIG. 4 is a perspective view of one embodiment of an array of cascode gain stages having their terminals ordered as base-emitter-collector to emitter-base-collector (BEC-EBC) using the novel cascode gain stage structure described above in FIGS. 1-3. An array of cascode gain stages is formed using a plurality of the cascode gain stages, each alternatively referred to as a "finger" 400, electrically coupled together to form a single amplifier 405. In one embodiment, a plurality of common-emitter connected transistors (Q1) 410 may each have a respective first base metal contact 100, a first emitter metal contact (E1) (not shown) and a first collector metal contact (C1) 110, such as described in the discussion, above. The amplifier 405 may have a plurality of common-base connected transistors (Q2) 415 each having the second emitter metal contact (E2) (not shown), the second base metal contact (B2) 205, the second collector metal contact (C2) 210, and a u-shaped second collector interface metal 212 connected to the second collector metal contact, (C2) 210 the u-shaped second collector interface metal 212 having the plurality of collector arms (215, 220), such as described in the discussion, above. Each may also have the transistor interconnect metallic strap 140 electrically coupled between the second emitter metal contact (E2) 200 (see FIG. 2) and the first collector metal contact 110, the second emitter metal contact (E2) 200 (see FIG. 2) disposed between the first collector metal contact 110 and the second base metal contact (B2) 205. The slotted base intra-connect metallic strap 235 may be in communication with each of the plurality of second base metal contacts (B2) 205, the slotted base intra-connect metallic strap 235 having first and second cutouts (240, 245) with each respective cutout disposed above a respective collector arm in each of the plurality of common-base connected transistors. Each cutout may reduce collector-base coupling. The first collector metal contact 110 and second emitter metal contact 200 are connected by the transistor interconnect metallic strap 140 without high-aspect ratio traces to reduce series resistance and series inductance. The u-shaped first collector interface metal 115 may be electrically connected to the first collector metal contact (C1) 110, with first and second collector arms (120, 125) of the u-shaped metal 115 bisected by an emitter strip 130 (the area generally under the first emitter metal contact 105) (see FIG. 1).

In one embodiment, a second collector intra-connect metallic strap 420 is in communication with each second collector metal contact 210 in the plurality of common-base connected transistors (Q2) 415. The first base intra-connect metallic strap 135 may be in communication with each first base metal contact 100 in the plurality of common-emitter connected transistors 410. In another embodiment, a first emitter intra-connect metallic strap 137 is in communication with each first emitter metal contact 105 in the plurality of common-emitter connected transistors (Q1) 410.

Figure 5:
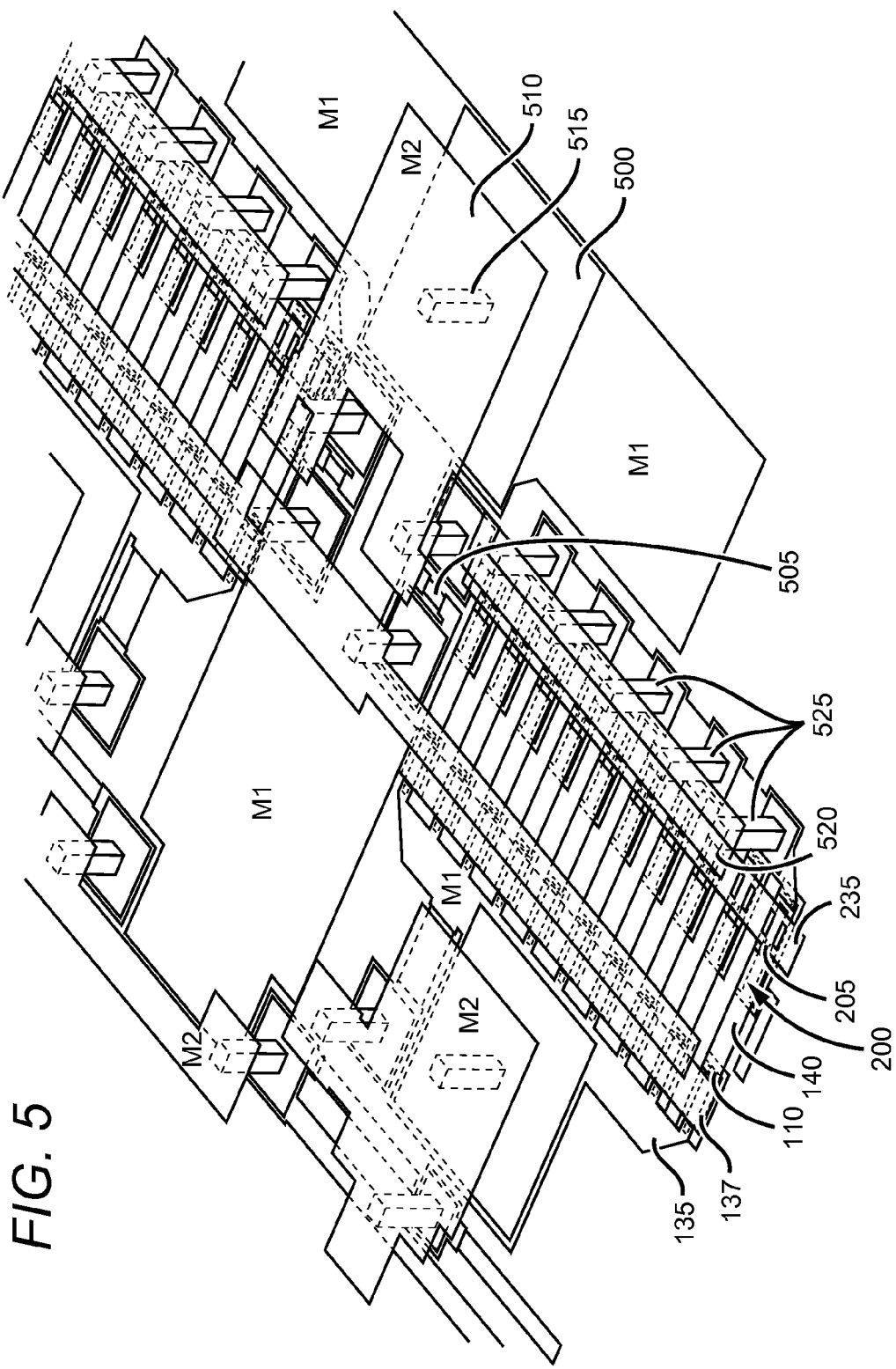
FIG. 5 is a perspective system view of two duplicated ten-finger cascode cells in an array.

FIG. 5 is a perspective system view of two duplicated ten-finger cascode cells in an array. Portions of a single first metal layer (M1) may define the base transistor intra-connect metallic strap 135, emitter transistor intra-connect metallic strap 137, transistor interconnect metallic strap 140, the slotted base intra-connect metallic strap 235, and the second collector intra-connect metallic strap 520. The slotted base intra-connect metallic strap 235 may connect each of the common-base transistors (Q2) to ground through a capacitor 500, although not grounded directly to the system ground because system ground preferably has a bias voltage (VB2) on it which may be substantially above ground potential.

A second metal layer (M2) runs across the entire length of the fingers to accept a second DC bias voltage (VB2). A VB2 resistor 505 may be electrically connected to the second metal layer (M2) to stabilize the VB2 bias. The VB2 resistor 505 may be located physically below but connected on one side to the first metal layer (M1), with M1 also electrically connected to the slotted base intra-connect metallic strap 235. A portion of the second metal layer (M2) forms a shunt 510 or parallel connection to the capacitor 500, with the shunt 510 serving as the system ground. The other side of the capacitor is connected to M2 through a via 515 which goes to the top plate of the capacitor 500. The VB2 bus is electrically connected to the resistor 505 and then it feeds all the transistors in the shunt 510. The collector output pad 520 for the common-base connected transistors (Q2) is electrically connected at the second metal layer (M2) though a one or more vias 525. The collector output pad 520 of the aggregate cascode finger cells 400 is also the source of the collector voltage for bias in this transistor.

During operation, an RF signal and the base voltage (VB1) for the common-emitter transistor (Q1) is communicated from the metal layer (M1) to the first base metal contact (B1) 100. The first emitter metal contact 105 is electrically tied to a system ground through the first emitter intra-connect metallic strap 137 from portions of M1 that connect one or more cascode fingers 400. The output of the common-base transistor (Q1) is at the first collector metal contact (C1) 110, with the signal communicated through the transistor interconnect metallic strap 140 to the second emitter metal contact 200 which is the input of the common-base connected transistor (Q2). The length of the strap 140 may be adjusted for optimum RF performance to accomplish a specific signal delay.

The second base metal contact (B2) 205 may be in electrical communication with the slotted base intra-connect metallic strap 235 and may be AC grounded, but not DC grounded directly to the system ground because it has a bias voltage (VB2) on it which may be substantially above ground potential. The slotted base intra-connect metallic strap 235 may connect to a capacitor 505, with one side of the capacitor 505 shown in between two duplicated ten-finger cascode cells. The purpose of the slotted base intra-connect metallic strap 235 is to allow an RF capacitor to AC ground the common-base of the common-base connected transistor (Q2). An output of the common-base connected transistors (Q2) for multi-finger cascode cells in the array may be taken from the collector pad 520.

While various implementations of the invention have been described, it will be apparent to those of ordinary skill in the art that many more embodiments and implementations are possible that are within the scope of this invention.

What is claimed is:

1. A cascode gain stage apparatus, comprising:
  a common-emitter connected transistor having a first base metal contact, first emitter metal contact, a first collector metal contact; and
  a common-base connected transistor having a second emitter metal contact, a second base metal contact, and a second collector metal contact, the second emitter metal contact in communication with the first collector metal contact through a transistor interconnect metallic strap, the second emitter metal contact disposed between the first collector metal contact and the second base metal contact;

wherein the first collector metal contact and second emitter metal contact are connected by the transistor interconnect metallic strap.

2. The apparatus of claim 1, further comprising:
a u-shaped second collector interface metal connected to the second collector metal contact, the u-shaped second collector interface metal having first and second collector arms; and
a second emitter strip bisecting the first and second collector arms, the second emitter strip in communication with the second emitter metal contact.

3. The apparatus of claim 2, further comprising:
a slotted base intra-connect metallic strap in communication with the second base metal contact, the slotted base intra-connect metallic strap having a first cutout disposed above the first collector arm;
wherein the first cutout reduces collector-base coupling in the common-base connected transistor.

4. The apparatus of claim 3, wherein the slotted base intra-connect metallic strap further comprises a second cutout disposed above the second collector arm.

5. The apparatus of claim 3, wherein the slotted base intra-connect metallic strap and transistor interconnect metallic strap are formed from a single metal layer.

6. The apparatus of claim 1, wherein the second emitter metal contact is configured in a fin in communication with the transistor interconnect metallic strap.

7. The apparatus of claim 1, further comprising:
a first emitter intra-connect metallic strap in communication with the first emitter metal contact.

8. The apparatus of claim 1, wherein the first emitter metal contact is configured in a fin.

9. The apparatus of claim 1, further comprising:
a u-shaped first collector interface metal having first and second collector arms;
a first emitter strip bisecting the first and second collector arms, the first emitter strip in communication with the first emitter metal contact.

10. An array of cascode gain stages, comprising:
a plurality of a common-emitter connected transistors each having a first base metal contact, first emitter metal contact and a first collector metal contact; and
a plurality of common-base connected transistors each comprising:
a second emitter metal contact,
a second base metal contact,
a second collector metal contact; and
a u-shaped second collector interface metal connected to the second collector metal contact, the u-shaped second collector interface metal having a plurality of collector arms;
a plurality of transistor interconnect metallic straps electrically coupled between each of the plurality of second emitter metal contacts and each of the plurality of first collector metal contacts, each of the plurality of second emitter metal contacts disposed between each of the plurality of first collector metal contacts and each of the plurality of second base metal contacts,
a slotted base intra-connect metallic strap in communication with each of the plurality of second base metal contacts, the slotted base intra-connect metallic strap having a plurality of cutouts with each respective cutout disposed above a respective collector arm in each of the plurality of common-base connected transistors;
wherein each cutout reduces collector-base coupling and base inductance and each of the plurality of first collector metal contacts and each of the plurality of second emitter metal contacts are connected by each of the plurality of transistor interconnect metallic straps.

11. The array of claim 10, further comprising:
a second collector intra-connect metallic strap in communication with each second collector metal contact in the plurality of common-base connected transistors.

12. The array of claim 10, further comprising:
a first base intra-connect metallic strap in communication with each first base metal contact in the plurality of common-emitter connected transistors.

13. The array of claim 10, further comprising:
a first emitter intra-connect metallic strap in communication with each first emitter metal contact in the plurality of common-emitter connected transistors.

14. The array of claim 10, wherein the plurality of cutouts are first and second cutouts disposed over first and second arms, respectively, for each of the plurality of common-base connected transistors.

15. A transistor, comprising:
a base metal contact on a substrate;
a collector metal contact disposed on a u-shaped first collector interface metal, the u-shaped first collector interface metal having first and second collector arms on the substrate;
an emitter metal contact configured in a fin extending from an emitter strip in the substrate; and
a slotted base intra-connect metallic strap disposed on the base metal contact, the slotted base intra-connect metallic strap having a first and second cutout disposed above the first and second collector arms of the u-shaped first collector interface metal.

16. The transistor of claim 15, further comprising:
an emitter transistor intra-connect metallic strap in communication with the emitter metal contact.

17. The transistor of claim 15, wherein the emitter metal contact and the base metal contact bisect the first and second collector arms.

18. The transistor of claim 15, further comprising a transistor interconnect metallic strap in communication with the emitter metal contact.

19. The transistor of claim 18, wherein the transistor interconnect metallic strap and the slotted base intra-connect metallic strap are configured from a single metal layer.

20. The transistor of claim 15, wherein the base metal contact is disposed between the emitter metal contact and the collector metal contact.

* * * * *